(12) United States Patent
Chen et al.

(10) Patent No.: US 9,515,040 B2
(45) Date of Patent: Dec. 6, 2016

(54) PACKAGE STRUCTURE AND FABRICATION METHOD THEREOF

(71) Applicant: Siliconware Precision Industries Co., Ltd., Taichung (TW)

(72) Inventors: Yan-Heng Chen, Taichung (TW); Mu-Hsuan Chan, Taichung (TW); Chieh-Yuan Chi, Taichung (TW); Chun-Tang Lin, Taichung (TW)

(73) Assignee: Siliconware Precision Industries Co., Ltd., Taichung (TW)

( * ) Notice: Subject to any disclaimer, the term of this patent is extended or adjusted under 35 U.S.C. 154(b) by 0 days.

(21) Appl. No.: 14/736,436

(22) Filed: Jun. 11, 2015

(65) Prior Publication Data

US 2016/0013146 A1  Jan. 14, 2016

(30) Foreign Application Priority Data

Jul. 11, 2014  (TW) .............................. 103123900 A

(51) Int. Cl.
| | | |
|---|---|---|
| *H01L 23/00* | (2006.01) | |
| *H01L 21/56* | (2006.01) | |
| *H01L 25/10* | (2006.01) | |

(52) U.S. Cl.
CPC ............. *H01L 24/19* (2013.01); *H01L 21/568* (2013.01); *H01L 25/105* (2013.01); *H01L 2224/04105* (2013.01); *H01L 2224/12105* (2013.01); *H01L 2224/16145* (2013.01); *H01L 2225/1035* (2013.01); *H01L 2225/1058* (2013.01); *H01L 2924/014* (2013.01); *H01L 2924/18162* (2013.01)

(58) Field of Classification Search
None
See application file for complete search history.

(56) References Cited

U.S. PATENT DOCUMENTS

2013/0249115 A1* 9/2013 Lin ........................ H01L 23/13
257/777

* cited by examiner

*Primary Examiner* — Anthony Ho
*Assistant Examiner* — Kevin Quinto
(74) *Attorney, Agent, or Firm* — Mintz Levin Cohn Ferris Glovsky and Popeo, P.C.; Peter F. Corless; Steven M. Jensen

(57) ABSTRACT

A method for fabricating a package structure is provided, including the steps of: sequentially forming a metal layer and a dielectric layer on a first carrier, wherein the dielectric layer has a plurality of openings exposing portions of the metal layer; disposing an electronic element on the dielectric layer via an active surface thereof and mounting a plurality of conductive elements of metal balls on the exposed portions of the metal layer; forming an encapsulant on the dielectric layer for encapsulating the electronic element and the conductive elements; removing the first carrier; and patterning the metal layer into first circuits and forming second circuits on the dielectric layer, wherein the second circuits are electrically connected to the electronic element and the first circuits. The invention dispenses with the conventional laser ablation process so as to simplify the fabrication process, save the fabrication cost and increase the product reliability.

15 Claims, 5 Drawing Sheets

PACKAGE STRUCTURE AND FABRICATION METHOD THEREOF

CROSS-REFERENCES TO RELATED APPLICATIONS

This application claims under 35 U.S.C. §119(a) the benefit of Taiwanese Application No. 103123900, filed Jul. 11, 2014, the entire contents of which are incorporated herein by reference.

BACKGROUND OF THE INVENTION

1. Field of the Invention

The present invention relates to package structures and fabrication methods thereof, and more particularly, to a package structure and a fabrication method thereof having reduced processes.

2. Description of Related Art

Along with the rapid development of electronic industries, electronic products are required to be much lighter, thinner, shorter and smaller and multi-functional. Accordingly, there have been developed various types of semiconductor packages. In particular, PoP (Package on Package) technologies have been developed to meet the requirement of semiconductor devices for high performance, high power efficiency, high speed, high integration and small size.

FIGS. 1A and 1B are schematic cross-sectional views showing a method for fabricating a PoP structure according to the prior art.

Referring to FIG. 1A, a carrier 10 having a plurality of conductive pads 101 and a plurality of conductive vias 102 is provided. Then, an electronic element 11 having a plurality of electrode pads 110 is disposed on the carrier 10 and electrically connected to the conductive vias 102 through the electrode pads 110. Subsequently, an encapsulant 12 is formed to encapsulate the electronic element 11 and the conductive pads 101. Thereafter, a grinding process is performed on the encapsulant 12 to expose a surface of the electronic element 11 from the encapsulant 12.

Referring to FIG. 1B, a plurality of openings 121 are formed in the encapsulant 12 by laser ablation for exposing the conductive pads 101. Subsequently, a plurality of conductive elements (not shown) are formed in the openings 121 of the encapsulant 12. As such, a package can be stacked on and electrically connected to the conductive pads 101, thereby forming a PoP structure.

However, since the conductive pads 101 are encapsulated by the non-transparent encapsulant 12, the positions of the conductive pads 101 are difficult to be identified and consequently the openings 121 are usually formed with a positional deviation.

Further, when the openings 121 are formed by laser ablation, debris is easily generated near the openings 121 and needs to be cleaned through a cleaning process, thereby complicating the fabrication process. Furthermore, the cleaning process causes sidewalls of the openings 121 to become uneven. Therefore, a delamination easily occurs between the openings 121 and the conductive elements formed in the openings 121 and consequently the product reliability is reduced. In addition, since the openings 121 need to be formed one by one by the laser ablation process and a laser ablation device is quite expensive, both the fabrication time and cost are increased.

Therefore, how to overcome the above-described drawbacks has become critical.

SUMMARY OF THE INVENTION

In view of the above-described drawbacks, the present invention provides a package structure, which comprises: an electronic element having an active surface with a plurality of electrode pads and an inactive surface opposite to the active surface; an encapsulant encapsulating the electronic element and having a first surface exposing the active surface of the electronic element and a second surface opposite to the first surface; a plurality of conductive elements of metal balls penetrating the first and second surfaces of the encapsulant; and a redistribution layer formed on the first surface of the encapsulant and the active surface of the electronic element and electrically connected to the electrode pads of the electronic element and the conductive elements.

The present invention further provides a method for fabricating a package structure, which comprises the steps of: sequentially forming a metal layer and a dielectric layer on a surface of a first carrier, wherein the dielectric layer has a plurality of openings for exposing portions of the metal layer; providing an electronic element having an active surface with a plurality of electrode pads and an inactive surface opposite to the active surface and disposing the electronic element on the dielectric layer via the active surface thereof, and mounting a plurality of conductive elements of metal balls on the exposed portions of the metal layer in the openings of the dielectric layer; forming an encapsulant on the dielectric layer for encapsulating the electronic element and the conductive elements, wherein the encapsulant has a first surface in contact with the dielectric layer and a second surface opposite to the first surface; removing the first carrier; and patterning the metal layer into a plurality of first circuits and forming a plurality of second circuits on the dielectric layer, wherein the second circuits are electrically connected to the electrode pads of the electronic element and the first circuits.

According to the present invention, a plurality of conductive elements are mounted before formation of the encapsulant and the conductive elements are exposed from the two opposite surfaces of the encapsulant. Therefore, the present invention dispenses with the conventional laser ablation process for forming openings in an encapsulant one by one and hence dispenses with the conventional cleaning process and a laser ablation device, thereby simplifying the fabrication process, shortening the fabrication time and saving the fabrication cost. Further, the present invention overcomes the conventional drawback of delamination of the conductive elements from uneven sidewalls of the openings so as to increase the product reliability and yield.

DETAILED DESCRIPTION OF PREFERRED EMBODIMENTS

The following illustrative embodiments are provided to illustrate the disclosure of the present invention, these and other advantages and effects can be apparent to those in the art after reading this specification.

It should be noted that all the drawings are not intended to limit the present invention. Various modifications and variations can be made without departing from the spirit of the present invention. Further, terms such as "first", "second", "on", "a" etc. are merely for illustrative purposes and should not be construed to limit the scope of the present invention.

FIGS. 2A to 2J are schematic cross-sectional views showing a method for fabricating a package structure 2 according to the present invention. Therein, FIG. 2C' shows another embodiment of FIG. 2C, FIG. 2F' shows another embodiment of FIG. 2F, and FIG. 2I' shows another embodiment of FIG. 2I.

Figure 1A:
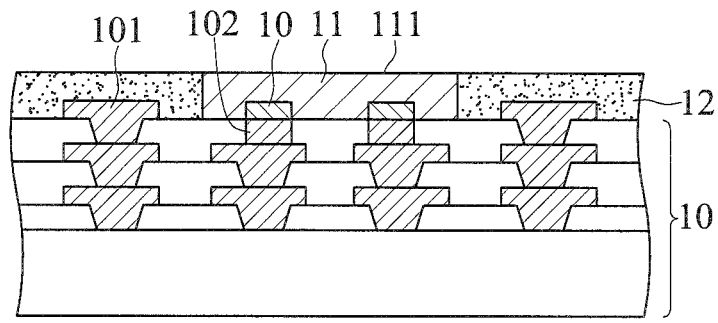
FIGS. 1A and 1B are schematic cross-sectional views showing a method for fabricating a PoP structure according to the prior art.
Figure 1B:
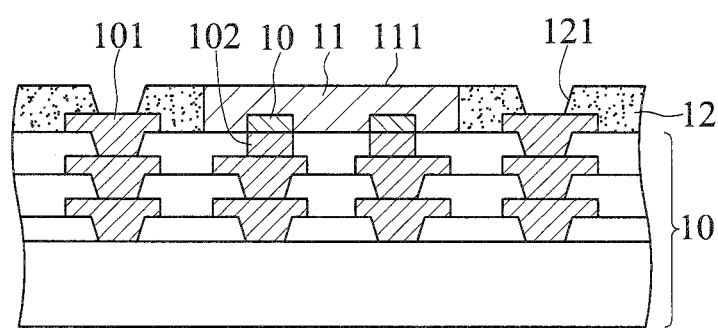
Figure 2A:
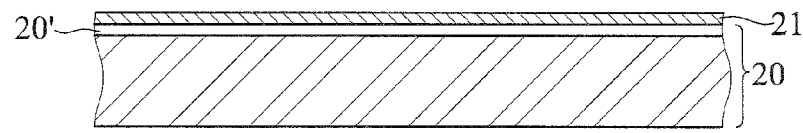
FIGS. 2A to 2J are schematic cross-sectional views showing a method for fabricating a package structure according to the present invention, wherein FIG. 2C' shows another embodiment of FIG. 2C, FIG. 2F' shows another embodiment of FIG. 2F, and FIG. 2I' shows another embodiment of FIG. 2I.

Referring to FIG. 2A, a first carrier 20 is provided and a metal layer 21 is formed on a surface of the first carrier 20. If needed, an adhesive layer 20' can be formed on the surface of the first carrier 20 for bonding the metal layer 21 to the first carrier 20. The adhesive layer 20' can be made of a heat-resistant adhesive.

In the present embodiment, the metal layer 21 is made of copper.

Figure 2B:
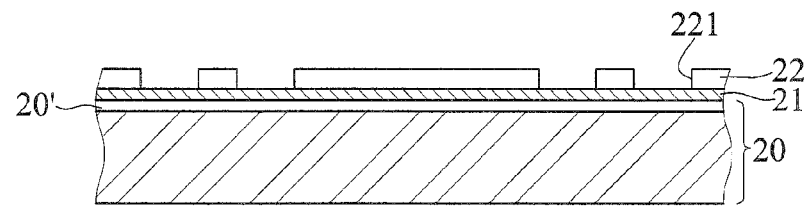

Referring to FIG. 2B, a dielectric layer 22 is formed on the metal layer 21 and patterned to form a plurality of openings 221 exposing portions of the metal layer 21.

Figure 2C:
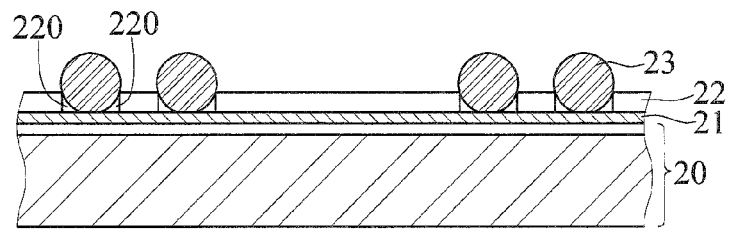
Figure 2C:
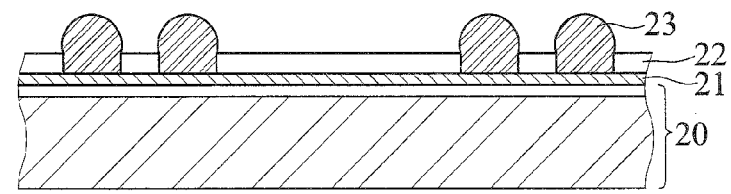

Referring to FIG. 2C, a plurality of first conductive elements 23 are mounted on the exposed portions of metal layer 21 in the openings 221 so as to be electrically connected to the metal layer 21. The first conductive elements 23 can be prefabricated metal balls, such as solder balls, which are heated to bond with the metal layer 21. A gap 220 can be formed between each of the openings 221 and the corresponding first conductive element 23. Alternatively, referring to FIG. 2C', the openings 221 can be completely filled by the corresponding first conductive elements 23.

Figure 2D:
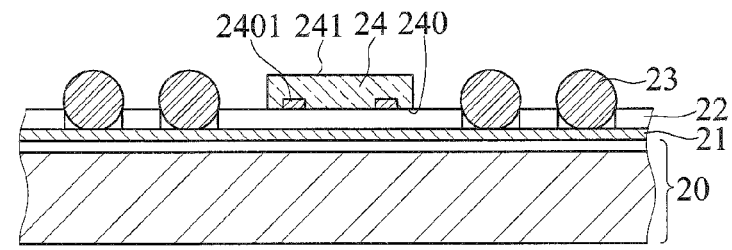

Referring to FIG. 2D, an electronic element 24 is disposed on the dielectric layer 22.

In the present embodiment, the electronic element 24 is an active element such as a chip, a passive element such as a resistor, a capacitor or an inductor, or a combination thereof.

The electronic element 24 has an active surface 240 with a plurality of electrode pads 2401 and an inactive surface 241 opposite to the active surface 240. The electronic element 24 is disposed on the dielectric layer 22 via the active surface 240 thereof.

Figure 2E:
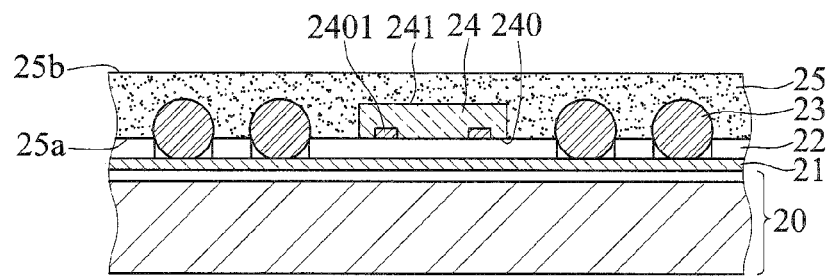

Referring to FIG. 2E, an encapsulant 25 is formed on the dielectric layer 22 for encapsulating the first conductive elements 23 and the electronic element 24. The encapsulant 25 has a first surface 25a in contact with the dielectric layer 22 and a second surface 25b opposite to the first surface 25a.

In the present embodiment, the encapsulant 25 is formed by molding.

The encapsulant 25 can be made of, but not limited to, a dry film or liquid epoxy resin, or an organic material, such as an ABF(Ajinomoto Build-up Film) resin.

Figure 2F:
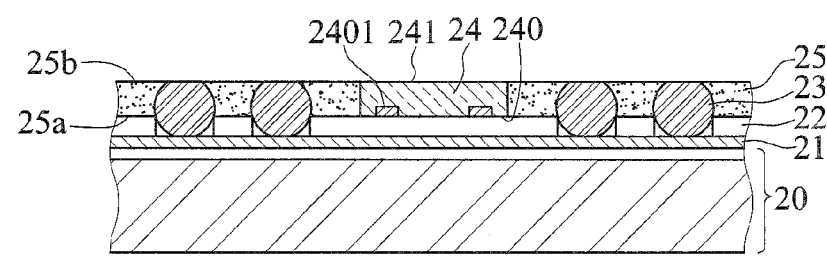
Figure 2F:
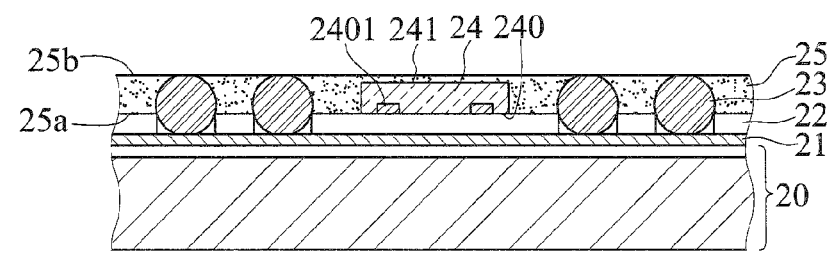

Referring to FIG. 2F, the encapsulant 25 is partially removed from the second surface 25b by grinding. As such, the first conductive elements 23 and the inactive surface 241 of the electronic element 24 are exposed from the second surface 25b of the encapsulant 25. The inactive surface 241 of the electronic element 24 is flush with the second surface 25b of the encapsulant 25.

In another embodiment, referring to FIG. 2F', after the grinding process, the inactive surface 241 of the electronic element 24 is not exposed from the second surface 25b of the encapsulant 25.

Figure 2G:
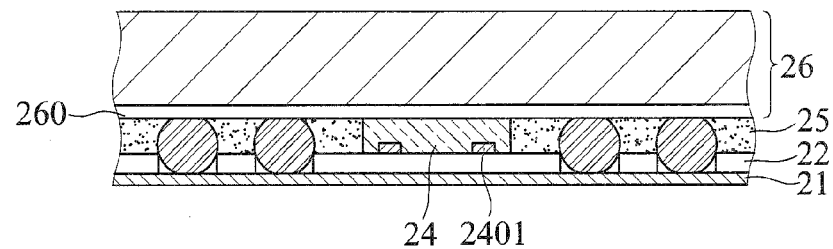

Referring to FIG. 2G, continued from FIG. 2F, a second carrier 26 having a release layer 260 is disposed on the second surface 25b of the encapsulant 25, and the first carrier 20 is removed to expose the metal layer 21.

Figure 2H:
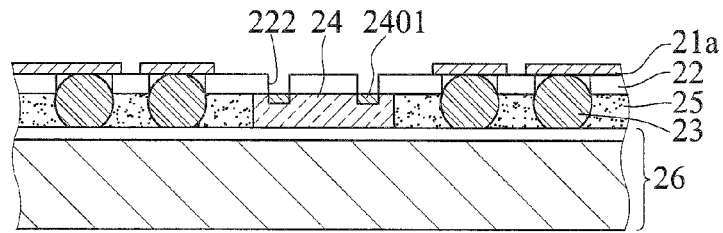

Referring to FIG. 2H, the metal layer 21 is patterned to form a plurality of first circuits 21a, and the dielectric layer 22 is patterned to form a plurality of via openings 222 exposing the electrode pads 2401 of the electronic element 24.

Figure 2I:
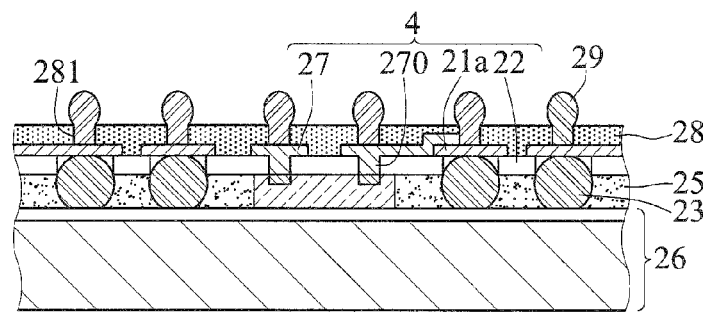
Figure 2I:
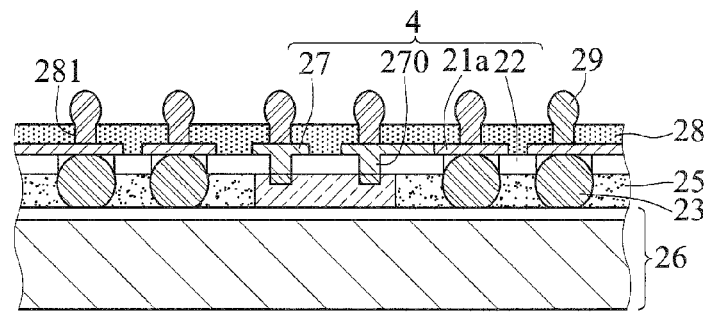

Referring to FIG. 2I, a plurality of conductive vias 270 are formed in the via openings 222 of the dielectric layer 22, and a plurality of second circuits 27 are formed on the dielectric layer 22 and electrically connected to the conductive vias 270. The conductive vias 270, the second circuits 27, the dielectric layer 22 and the first circuits 21a form a redistribution layer 4. The first circuits 21a and the second circuits 27 form a circuit layer (not denoted by a reference numeral). Then, an insulating layer 28 is formed on the redistribution layer 4 and has a plurality of openings 281 partially exposing the first circuits 21a and the second circuits 27. Thereafter, a plurality of second conductive elements 29, such as bond wires, solder balls or bumps, are formed in the openings 281 and electrically connected to the second circuits 27 and the first circuits 21a. In the present embodiment, the second circuits 27 extend onto the first circuits 21a. Alternatively, referring to FIG. 2I', the second circuits 27 are electrically connected to the first circuits 21a via side surfaces thereof.

Figure 2J:
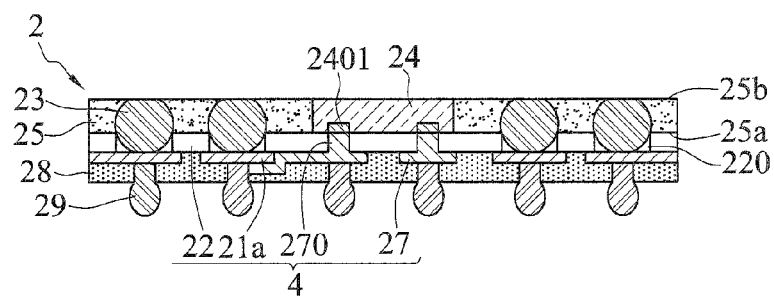

Referring to FIG. 2J, the second carrier 26 is removed and a singulation process is performed. As such, a package structure 2 is formed.

Figure 3:
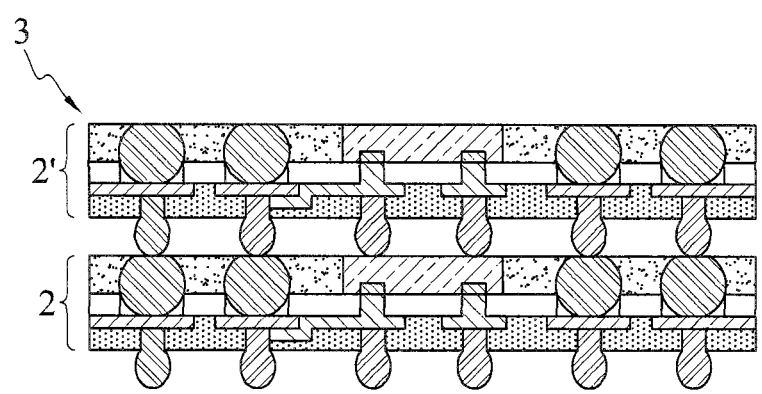
FIG. 3 is a schematic cross-sectional view of a PoP structure of the present invention.

Further, referring to FIG. 3, a package 2' is disposed on the package structure 2 to form a PoP structure 3.

The present invention further provides a package structure, which has: an electronic element 24 having an active surface 240 with a plurality of electrode pads 2401 and an inactive surface 241 opposite to the active surface 240; an encapsulant 25 encapsulating the electronic element 24 and having a first surface 25a exposing the active surface 240 of the electronic element 24 and a second surface 25b opposite to the first surface 25a; a plurality of first conductive elements 23 of metal balls penetrating the first and second surfaces 25a, 25b of the encapsulant 25; and a redistribution layer 4 formed on the first surface 25a of the encapsulant 25 and the active surface 240 of the electronic element 24 and electrically connected to the electrode pads 2401 of the electronic element 24 and the first conductive elements 23.

In the above-described structure, the metal balls can be solder balls. The first surface 25a of the encapsulant 25 can be flush with the active surface 240 of the electronic element 24.

The redistribution layer 4 can have a dielectric layer 22 formed on the first surface 25a of the encapsulant 25 and the active surface 240 of the electronic element 24 and penetrated by the first conductive elements 23, a plurality of first circuits 21a formed on the dielectric layer 22 and electrically connected to the first conductive elements 23, and a plurality of second circuits 27 formed on the dielectric layer 22 and electrically connected to the electrode pads 2401 and the first circuits 21a. The dielectric layer 22 can have a plurality of openings 221 for correspondingly receiving the first conductive elements 23 and a gap 220 can be formed between each of the openings 221 and the corresponding first conductive element 23. The second circuits 27 can extend onto the first circuits 21a.

In the above-described structure, the inactive surface 241 of the electronic element 24 can be flush with the second surface 25b of the encapsulant 25. The structure can further have a package 2' disposed on the second surface 25b of the encapsulant 25 and electrically connected to the first conductive elements 23.

According to the present invention, a plurality of conductive elements are mounted before formation of the encapsulant and the conductive elements are exposed from the two opposite surfaces of the encapsulant. Therefore, the present invention dispenses with the conventional laser ablation process for forming openings in an encapsulant one by one and hence dispenses with the conventional cleaning process and a laser ablation device, thereby simplifying the fabrication process, shortening the fabrication time and saving the fabrication cost. Further, the present invention overcomes the conventional drawback of delamination of the conductive elements from uneven sidewalls of the openings so as to increase the product reliability and yield.

The above-described descriptions of the detailed embodiments are only to illustrate the preferred implementation according to the present invention, and it is not to limit the scope of the present invention. Accordingly, all modifications and variations completed by those with ordinary skill in the art should fall within the scope of present invention defined by the appended claims.

What is claimed is:

1. A package structure, comprising:
an electronic element having an active surface with a plurality of electrode pads and an inactive surface opposite to the active surface;
an encapsulant encapsulating the electronic element and having a first surface exposing the active surface of the electronic element and a second surface opposite to the first surface;
a plurality of conductive elements penetrating the first and second surfaces of the encapsulant, wherein the conductive elements are metal balls; and
a redistribution layer formed on the first surface of the encapsulant and the active surface of the electronic element and electrically connected to the electrode pads of the electronic element and the conductive elements, wherein the redistribution layer has: a dielectric layer formed on the first surface of the encapsulant and the active surface of the electronic element and penetrated by the conductive elements; a plurality of first circuits formed on the dielectric layer and electrically connected to the conductive elements; and a plurality of second circuits formed on the dielectric layer and electrically connected to the electrode pads and the first circuits.

2. The structure of claim 1, wherein the metal balls are solder balls.

3. The structure of claim 1, wherein the first surface of the encapsulant is flush with the active surface of the electronic element.

4. The structure of claim 1, wherein the dielectric layer has a plurality of openings for correspondingly receiving the conductive elements and a gap is formed between each of the openings and the corresponding conductive element.

5. The structure of claim 1, wherein the second circuits extend onto the first circuits.

6. The structure of claim 1, wherein the inactive surface of the electronic element is flush with the second surface of the encapsulant.

7. The structure of claim 1, further comprising a package disposed on the second surface of the encapsulant and electrically connected to the conductive elements.

8. A method for fabricating a package structure, comprising the steps of:
sequentially forming a metal layer and a dielectric layer on a surface of a first carrier, wherein the dielectric layer has a plurality of openings for exposing portions of the metal layer;
disposing an electronic element having an active surface with a plurality of electrode pads and an inactive surface opposite to the active surface on the dielectric layer via the active surface thereof, and mounting a plurality of conductive elements on the exposed portions of the metal layer in the openings of the dielectric layer, wherein the conductive elements are metal balls;
forming an encapsulant on the dielectric layer for encapsulating the electronic element and the conductive elements, wherein the encapsulant has a first surface in contact with the dielectric layer and a second surface opposite to the first surface;
removing the first carrier; and
patterning the metal layer into a plurality of first circuits and forming a plurality of second circuits on the dielectric layer, wherein the second circuits are electrically connected to the electrode pads of the electronic element and the first circuits.

9. The method of claim 8, wherein a gap is formed between each of the openings of the dielectric layer and the corresponding conductive element.

10. The method of claim 8, wherein the second circuits extend onto the first circuits.

11. The method of claim 8, wherein the metal balls are solder balls.

12. The method of claim 8, before removing the first carrier, further comprising performing a grinding process to remove a portion of the encapsulant from the second surface so as to expose the conductive elements from the second surface of the encapsulant.

13. The method of claim 8, further comprising disposing a second carrier on the second surface of the encapsulant before removing the first carrier, and removing the second carrier after forming the first circuits and the second circuits.

14. The method of claim 8, after forming the first circuits and the second circuits, further comprising performing a singulation process.

15. The method of claim 8, after forming the first circuits and the second circuits, further comprising disposing on the second surface of the encapsulant a package electrically connected to the conductive elements.

* * * * *